March 22, 1955 H. Q. NORTH 2,704,818

ASYMMETRICALLY CONDUCTIVE DEVICE

Filed April 24, 1947

Inventors:
Harper Q. North,
by Merton D. Moore
Their Attorney.

2,704,818

ASYMMETRICALLY CONDUCTIVE DEVICE

Harper Q. North, Schenectady, N. Y., assignor to General Electric Company, a corporation of New York Application April 24, 1947, Serial No. 743,492

6 Claims. (Cl. 317—236)

Figure 1:
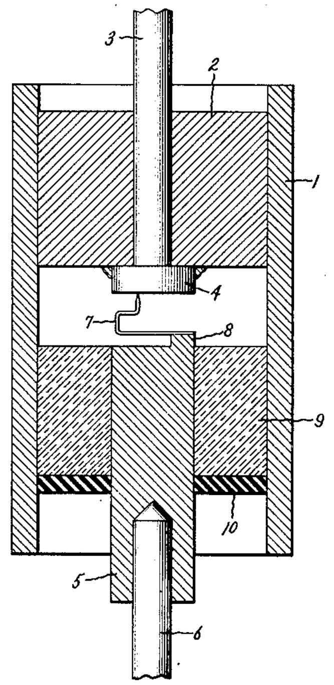

This invention relates to asymmetrically conductive devices such as crystal diodes and more particularly to welded germanium crystal diodes.

It is an object of the invention to provide an asymmetrically conductive device of improved characteristics.

An important object of the invention is to provide a crystal diode which will be resistant to burn out and which will have a very long useful life.

It is another object of the invention to provide an asymmetrically conductive device, such as a crystal diode, capable of acting as a rectifier, a detector, a modulator, an oscillator, an harmonic generator, a voltage regulator, or under certain conditions an amplifier, for radio frequency energy, particularly high radio frequency energy up to thousands of megacycles, as well as for lower frequencies.

An additional object is to provide an improved asymmetrically conductive device of the type embodying a semiconductor member and a contacting electrode, and more particularly such devices wherein the semiconductor material may be welded or alloyed with conductors such as the conductor comprising the contacting electrode.

Further objects are to provide small and efficient rectifiers of stable characteristics, which are not subject to damage from shock or vibrations, which are inexpensive to manufacture, which are adapted to a multiplicity of uses covering a wide range of frequencies, which have high back resistance and low forward resistance, which require no heater or other exciting power, and in which the capacitance between anode and cathode is of a low value.

It is an additional object to provide a crystal diode with a voltage-current characteristic which is logarithmic over an extended range of current.

Another object is to provide a crystal diode particularly adapted to the generation of harmonics at frequencies of the order of thousands of megacycles.

A still further object is to provide a crystal diode for use at high voltages which will possess a high back resistance and low forward resistance.

An additional object is to provide a method of welding together the two electrodes of a semiconductor or "boundary layer" type of asymmetrically conductive device which may comprise, for example, a device having the characteristics of a rectifier or diode.

The term "weld" as herein employed refers to the actual fusion of two metals together by melting so as to cause an inter-mixture of the metals across the fused interface. This is to be distinguished from a mere bonding or adhesion of the two metals by pressure, heat or friction, or by the use of known bonding materials, such as cements or solders.

The use in radio communication and other fields of microwave energy, as for instance energy at a frequency of thousands of megacycles, has made it difficult to design and build suitable vacuum tubes, with interelectrode capacitances small enough and electron transit time short enough to permit satisfactory operation of equipments employing such frequencies. Crystal diodes which have been developed to replace vacuum tubes in ultra and super high frequency applications have proved useful, and it is accordingly an object of the present invention to provide an improved crystal diode particularly adapted for use at such high radio frequencies.

Figure 4:
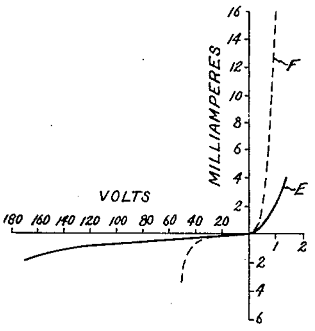
Figure 5:
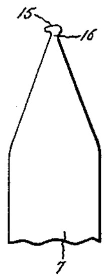
Figure 3:
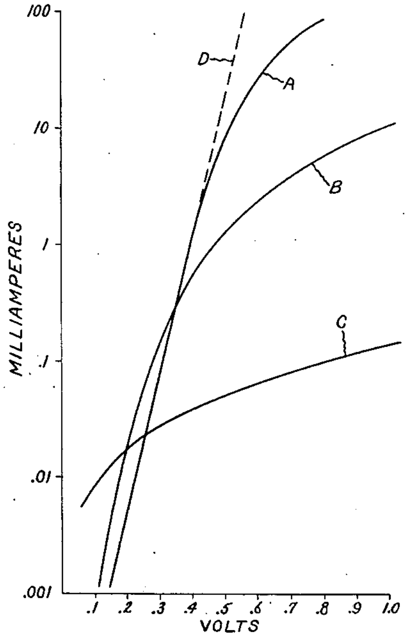
Figure 2:
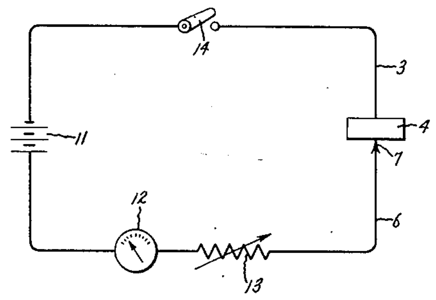

The novel features which I believe to be characteristic of the invention are set forth with particularity in the appended claims. The invention itself, however, both as to its organization and method of operation, together with further objects and advantages thereof may best be understood by reference to the following description taken in connection with the accompanying drawings, in which Fig. 1 is an enlarged view of a crystal diode in cutaway side view; Fig. 2 is a diagram of a circuit useful in manufacturing a crystal diode according to the invention; Fig. 3 and Fig. 4 are diagrammatic representations of the electrical characteristics of crystal diodes of several types; and Fig. 5 is a greatly enlarged view of the tip of a whisker from a diode according to the invention which has been torn away from the surface of the semiconductor pellet.

Referring now to Fig. 1 of the drawings, the complete diode comprises a shell 1 in the form of a tube, which may be of steel and about ¼ inch in diameter and ⅓ inch in length, which houses a cylindrical silver plug 2 having a copper conductor 3 extending axially therethrough and a pellet 4 of the semi-conductor germanium soldered at the end of the copper conductor flush with the lower face of the silver plug. The germanium semiconductor pellet may be about .06 inch in diameter and .02 inch thick and preferably consists of germanium with a minimum of impurities, or germanium to which has been added about .2 percent by weight of tin or about .2 or .5 atomic percent of antimony which may act as donors as discussed hereinafter. The soldered connection is preferably made by plating the germanium pellet with rhodium, which solder wets much more readily than it does germanium. The pellet is then soldered to the pretinned face of plug 2 across the end of conductor 3, tin being a suitable solder.

Also within the shell 1 is a steel rod 5 about .06 inch in diameter and .2 inch long having a copper conductor 6 connected at one end, such as by insertion and soldering into a round hole drilled in the end, the rod 5 carrying a pointed electrode or cat-whisker 7 of platinum-10 percent rutherium which is spot-welded to a small projection 8 upstanding from the upper end of the rod. The rod is firmly held in place within the shell by an insulating glass bead 9 which seals to the steel shell 1 and to the steel rod 5, the bead being of a glass of which the thermal coefficient of expansion approximately matches that of the rod and shell. A mica washer 10 fits firmly against the bead and between rod 5 and shell 1.

In constructing a diode of the type shown in Fig. 1, the cat-whisker 7 is first welded to rod projection 8, the glass bead is slipped over the rod, and then the rod and bead are slipped into the shell and externally clamped such as by a suitable jig in desired relative positions. The parts are now heated for 7 minutes in an 800° C. air furnace to melt the bead, the parts are removed from the furnace and the bead pressed flat into the configuration shown with the mica washer in place using a cold steel plunger or die against the mica washer 10 and a suitable die against the opposite face of the bead. The assembly may now be annealed at 400° C. in air and then permitted to cool slowly. The platinum-10 percent ruthenium cat-whisker 7 is preferably of .0015 inch diameter and of overall length before bending of about .1 inch. It is sharpened at the contact tip to provide an area of contact of the order of $10^{-7}$ to $10^{-8}$ square inches when in contact with the surface of the germanium pellet, the point or tip having been originally sharpened to a radius of about .00005 inch.

The germanium pellet is soldered to the face of silver plug 2 across the end of copper conductor 3 leaving a flashing of excess solder in the angle between the side of the pellet and the surface of the silver plug. The pellet is then polished to substantially optical smoothness on the flat exposed surface, the polishing being done preferably under water, first with 600 mesh Alundum on cloth and finally with fine magnesium oxide on cloth. Such polishing yields a uniform clean surface relatively free from strain which apparently results in uniformly low loss diodes for wavelengths as short as 1 centimeter.

The silver plug is now inserted in the shell 1 and is slowly pressed down until contact is just established between the tip of the cat-whisker 7 and the face of the germanium pellet. The exact position at which contact is established may be indicated by deflection of a meter included in an electrical circuit comprising essentially a source of potential and a current meter. Connections to the circuit are conveniently arranged through conductors 3 and 6. A suitable circuit is shown in Fig. 2 comprising potential source 11, meter 12, current limiting variable resistance element 13, and switch 14 all in series across the diode.

After contact is just established between cat-whisker 7 and the pellet, a pressure of about 150 milligrams between the tip and the pellet is obtained by pressing the silver plug .0005 inch further into the shell. This distance of .0005 inch represents the deflection of the cat-whisker bent as shown when the tip is subjected to about 150 milligrams pressure for platinum-10 precent ruthenium wire of .0015 inch diameter.

Preferably, the silver plug is now soldered or glued about the periphery of its upper face to the inside of the shell, though a pressed fit of the plug in the shell will usually be sufficient to hold the parts without solder. Glue or solder may be desirable as an hermetic seal to prevent moisture from later damaging the pellet or cat-whisker.

The next step in the construction is to pass a direct current through the diode, in the forward direction, that is using the cat-whisker as an anode and the pellet as a cathode, to weld or fuse the tip of the cat-whisker to the face of the pellet. One method by which such direct current welding may be accomplished is by passing extremely high currents through the diode for a very short period of time, usually less than one second, by such means as rapidly discharging a capacitor through the diode. Another method of direct current welding resulting in units particularly well suited for high voltage use or use at ultra high frequencies is to pass a direct current of predetermined magnitude from a substantially constant voltage source through the cat-whisker to the semiconductor member for a more extended period of time. This latter method may be practiced using the circuit of Fig. 2. Resistance 13 is made high when the switch 14 is closed and then slowly lowered to increase the current to the desired maximum.

For a cat-whisker sharpened to a point of about .0005 inch radius, and pressed against the pellet face by about 150 milligrams so as to give an area of contact of approximately $10^{-7}$ square inches, a satisfactory weld is obtained by passing for a few seconds, such as from 3 to 5 seconds, a current from whisker to pellet of between 100 and 400 milliamperes. A weld made by a current of 250 milliamperes has been found to have a tensile strength of 35,000 pounds per square inch, being able to support a tensile force of 500 milligrams. Currents less than 250 milliamperes are preferably employed when the area of contact is less than $10^{-7}$ square inches, and when the diode is to be used for wavelengths shorter than 10 centimeters.

In the manufacture of diodes for microwave applications which are hereinafter referred to as high frequencies to include those frequencies at which the interelectrode capacitance and noise voltages are of importance, it has been found desirable to use a small area of contact between whisker and pellet, of the order of $10^{-7}$ square inches or less, a small pressure between whisker and pellet of not more than 150 milligrams, low welding currents of not more than approximately 250 milliamperes, and a germanium pellet doped preferably with .2 atomic percent of antimony, in which the antimony serves as a donor to decrease the resistivity of the pellet. Units so constructed display very low forward resistance; a substantially logarithmic current-voltage characteristic over three decades of current, and except for the spreading resistance which is nonlinear with current, over five decades of current; a high back resistance; and a capacitance across the rectifying boundary layer, of approximately .2 micromicrofarads, the total interelectrode capacitance of the unit constructed as described being approximately 1 micromicrofarad.

Units comprising an antimony doped pellet and with a contact area of less than $10^{-8}$ square inches from the use of a pressure of 50 milligrams between the whisker and the surface of the semiconductor, and a welding current of 50 milliamperes, have proven useful at wavelengths less than 1 cm., having a capacitance of even less than .2 mmfd. across the barrier layer. Such units have been used successfully as harmonic generators of 4 millimeter wave energy.

Referring to Fig. 3, a family of curves of forward current, on a logarithmic vertical scale, against forward voltage, on a horizontal linear scale, is shown for a welded microwave diode with an antimony-doped germanium pellet, curve A; for a welded diode with a tin-doped germanium pellet, curve B; and for comparison, for a non-welded silicon pellet diode of a type heretofore known, curve C. There is also shown by a dashed line D extending from the linear portion of curve A a plot of the current theoretically obtainable for an antimony-doped germanium welded diode if the spreading resistance could be compensated for. It will be noted that the practical unit, curve A, provides substantially linear (logarithmic) response from a current of .001 milliamperes up to more than 1 milliampere, the characteristics of other types of crystal diodes being linear for much shorter ranges, curves B and C. The very low forward resistance, indicated by the steepness of the curve A, and the wide range of current linearity make the welded antimony-doped germanium diode particularly suited to microwave applications.

In the construction of diodes for use at lower frequencies and higher voltages, it has been found desirable to use germanium pellets without added donors, or pellets doped with .2 atomic percent tin, the latter being also suitable for some high frequency applications.

The cat-whisker may be sharpened to a point with a radius of between .00005 and .0001 inch, a pressure of 150 milligrams may be applied between whisker and pellet, and welding currents of about 250 to 400 milliamperes are suitable.

Diodes made in accordance with the above for high voltages may have a forward resistance of 100 ohms at +1 volt and up to 1 megohm back resistance at −1 volt. The back resistance is maintained at a high level to as much as −100 volts or more in some units.

The characteristics of high voltage welded diodes are indicated in Fig. 4 by a curve E, representing a welded contact diode comprising a pellet of germanium without added donors, and by curve F for a diode comprising a tin-doped germanium pellet. While the tin-doped unit provides a lower forward resistance, passing a little more than 16 milliamperes at 1 volt, the back voltage characteristics of the unit with the un-doped pellet are more desirable, passing one milliampere at a voltage of about (—) 120 volts (curve E) whereas the tin doped unit passes this current at about (—) 58 volts. The back voltage characteristics of antimony-doped germanium diodes have been found to be such as to make such units generally unsuitable for high voltage operation. It will be apparent that the steep logarithmic current-voltage characteristic curve of the welded germanium diodes makes them useful as voltage regulators, as well as modulators and harmonic generators.

The welded joint between whisker tip and pellet provides several advantages. The unit is stabilized in that there can be no shifting of the point of contact in ordinary usage, and dropping the unit from several feet to a hard floor results in no damage to the device. The area of contact is fixed assuring electrical stability and adherence to original characteristics. The welded germanium diode has high resistance to impairment of electrical performance from overvoltages, and also recovers from those overvoltages and resultant excessive currents which destroy the rectifying barrier layer by overheating the rectifying contact, since cooling the diode thereafter restores substantially its original characteristics.

In addition, by applying a tensile stress on the weld, it is possible to alter the characteristics of high frequency diodes. A tensile stress of 400 milligrams, for instance, decreases the back resistance of microwave diodes in the neighborhood of −1 volt, the forward resistance being very little affected.

It is thought that many of the desirable electrical characteristics obtainable in diodes constructed as described are the result of interposing the weld between the whisker and pellet. This weld is thought to comprise an alloy of the elements of which the pellet and whisker are comprised. In a typical case, therefore, the weld would comprise an alloy of germanium-platinum-ruthenium with perhaps a very small amount of antimony or tin. Some of the electrical characteristics may also be the result of the mechanical relationship of the whisker tip and the pellet established by the interposition of the weld.

The nature of the weld may be better understood from Fig. 5 which is reproduced from a photomicrograph of the tip of a whisker which had been broken away from the surface of the germanium pellet after welding. The small bead 15 on the top is separated from the body of the whisker 7 by a neck-like portion 16. Parts of the bead 15 apparently comprise the weld consisting of the alloyed metals. The throat 16 is approximately .0001 inch in cross sectional diameter. Since a force of 35,000 pounds per square inch is necessary to break away the tip of the whisker from the pellet, as shown, the weld made in accordance with the invention is strong mechanically.

The spreading resistance of the diode, which is related to the area of contact between whisker and pellet and to the resistivity of the pellet, has been found to be for welded diodes less than for non-welded diodes. This may be explained by the hemispherical contact established by the weld as indicated by the shape of the bead 15 of Fig. 5. Before welding, the flattened end of the whisker tip is in contact with the surface of the semi-conductor pellet. The spreading resistance under these circumstances is approximately equal to the pellet resistivity divided by twice the diameter of contact. After welding, the weld is thought to form a contact of approximately hemispherical shape with the semi-conductor. The spreading resistance has been found to be approximately equal to the resistivity divided by $\pi$ times the same diameter of contact, for the welded unit. There are, however, other possible explanations for this desirable property. The lower spreading resistance is thought to have some effect in reducing the tendency to burn-out and other desirable characteristics of the welded diode.

In general it may be said that in producing diodes for higher frequencies, less welding current should be used since the area of contact should be smaller than for lower frequency uses. Welding the contact decreases the noise generated by the diode at high radio frequencies and currents of about 250 milliamperes have been found to give optimum performance characteristics for units intended for use at 3 centimeter wavelength, providing an interelectrode capacitance across the barrier layer of about 0.2 mmfd. Currents of 100 milliamperes have been found to be more in order for welding the contact of diodes for use at 1 centimeter wavelength. There is somewhat more inherent noise in the latter case but the capacitance across the rectifying contact will be somewhat smaller than 0.2 mmfd.

The addition of .2 atomic percent of antimony has been found to reduce the resistivity of the germanium pellet from about 10 ohm centimeters to about .005 ohm centimeters under average conditions. A pellet of this constituency is useful in practicing my invention and welded diodes of this type are particularly suitable for very high or super high radio frequency applications. The maximum permissible back voltage of such units is generally between .5 and 1 volt, but the forward resistance is very low as shown by curve A of Fig. 3.

Germanium without added donors, such as tin or antimony, which has been heated in a dry nitrogen atmosphere of 1015° C. for twenty minutes used in a welded contact diode exhibits a high back resistance up to about 140 volts at room temperatures, but at −78° C. the back resistance remains high at 240 volts. Pure germanium melted in a vacuum has also been found to possess high back voltage characteristics, up to over 100 volts, as shown by curve F in Fig. 4, and to be a suitable material for the pellet in a high voltage welded contact diode. Other treatments will be found to otherwise affect the characteristics of the diode, these characteristics being very sensitive to impurities, donors or doping agents in the germanium, as well as to the temperature of the germanium.

Other whisker materials have been found to be satisfactory for use in my invention, although platinum alloys are particularly suitable because of resistance to oxidation during welding and heating and because of the hardness of the material. Tungsten, for instance, oxidizes relatively rapidly when heated in air, but may be used as a whisker which gives a satisfactory service and which may be satisfactorily welded to the germanium if suitable gaseous atmospheres are utilized. Also suitable are whiskers of different diameters, shapes and lengths. For instance a platinum-25 percent Iridium wire of .003 inch diameter pointed to give a contact of about .0002 inch diameter has been successfully welded to a .2 atomic percent antimony germanium pellet using 200 milliamperes of current. The whisker in this case was S shaped and pressed against the pellet with a force of 1.6 grams. While welded diodes with larger whiskers pressed more heavily against the semiconductor member are operative and possess advantages over other types of crystal diodes, whiskers of less diameter than .003 inch, and originally pressed with less than 1.6 grams against the pellet, produce diodes better adapted to most uses. Larger diameter whiskers are, however, indicated if high operating currents are desired and if high whisker resistance due to heating is to be minimized. In general, the smaller the contact area, the lower the current needed to complete a satisfactory weld. Lower welding currents and sharper whisker points are generally desirable to provide a greater ratio between forward resistance and back resistance, as well as lower boundary layer capacitance from whisker to pellet.

While I have shown only certain preferred embodiments of the invention by way of illustration, many modifications will occur to those skilled in the art and I, therefore, wish to have it understood that I intend, in the appended claims, to cover all such modifications as fall within the true spirit and scope of my invention.

What I claim as new and desire to secure by Letters Patent of the United States is:

1. A germanium diode for microwave use comprising a pellet of germanium containing approximately .2 atomic percent antimony, and a pointed wire whisker welded at the pointed end to the surface of said pellet.

2. A crystal diode for use at high radio frequencies comprising a pellet of germanium with antimony as a donor, a sharply pointed conducting member, the point of said member being in contact with said pellet over an area of not more than about $10^{-7}$ square inches, and a weld at said point connecting said member and said pellet.

3. A high frequency germanium crystal rectifier comprising a sharpened electrode welded at its sharpened end to a member of germanium with antimony as a donor.

4. A germanium crystal diode comprising a bent wire whisker sharpened at one end, a germanium semiconductor pellet containing approximately 0.2 to 0.5 atomic percent antimony with a surface in contact with said end through a welded joint, a supporting member for said pellet, insulating means for supporting said whisker, and a conductive casing enclosing said pellet and said whisker and hermetically sealed to said supporting member and to said insulating means.

5. A rectifier suitable for use at high radio frequencies comprising a substantially planar electrode comprising a pellet of germanium with antimony as a donor and a counterelectrode in contact therewith over an area having one dimension of between about .00005 inch and about .0005 inch, said electrodes being welded together at said contact area.

6. The crystal diode of claim 2 wherein the pellet of semiconductor material consists essentially of germanium containing approximately 0.2 atomic per cent antimony.

References Cited in the file of this patent

UNITED STATES PATENTS

| | | |
|---|---|---|
| 1,961,825 | Harty | June 5, 1934 |
| 2,162,487 | Lotz | June 13, 1939 |
| 2,402,839 | Ohl | June 25, 1946 |
| 2,406,405 | Salisbury | Aug. 27, 1946 |
| 2,415,841 | Ohl | Feb. 18, 1947 |
| 2,441,590 | Ohl | May 18, 1948 |
| 2,504,628 | Benzer | Apr. 18, 1950 |
| 2,514,879 | Lark-Horovitz et al. | July 11, 1950 |
| 2,530,110 | Woodyard | Nov. 14, 1950 |
| 2,646,536 | Benzer et al. | July 21, 1953 |

OTHER REFERENCES

Electronics, February 1946, pages 118 to 123.

Electronic Eng., February 1946, page 50.

Proc. National Academy of Science, vol. 2, 1925, pages 743–748.

J. Applied Physics, North, vol. 17, November 1946, pp. 912–923.

Merritt, N. A. S., vol. 11 (1925), pp. 743–748.